(12) United States Patent
Wang et al.

(10) Patent No.: US 9,001,613 B2
(45) Date of Patent: Apr. 7, 2015

(54) TRACKING MECHANISMS

(75) Inventors: Bing Wang, Palo Alto, CA (US);
Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 428 days.

(21) Appl. No.: 13/397,415

(22) Filed: Feb. 15, 2012

(65) Prior Publication Data
US 2013/0208554 A1    Aug. 15, 2013

(51) Int. Cl.
G11C 8/18 (2006.01)
G11C 7/18 (2006.01)
G11C 7/22 (2006.01)
G11C 11/419 (2006.01)

(52) U.S. Cl.
CPC ...... *G11C 7/18* (2013.01); *G11C 7/227* (2013.01); *G11C 11/419* (2013.01)

(58) Field of Classification Search
USPC ............. 365/233.11, 191, 233.1, 233.12
See application file for complete search history.

(56) References Cited

U.S. PATENT DOCUMENTS

| | | | | |
|---|---|---|---|---|
| 7,577,052 B2 * | 8/2009 | Wu et al. | ............ | 365/226 |
| 8,300,491 B2 * | 10/2012 | Tao et al. | ............ | 365/230.03 |
| 8,559,209 B2 * | 10/2013 | Siau | ............ | 365/148 |
| 8,605,523 B2 * | 12/2013 | Tao et al. | ............ | 365/194 |
| 8,619,479 B2 * | 12/2013 | Yoon | ............ | 365/193 |
| 8,630,132 B2 * | 1/2014 | Cheng et al. | ............ | 365/189.14 |

* cited by examiner

*Primary Examiner* — Pho M Luu
(74) *Attorney, Agent, or Firm* — Lowe Hauptman & Ham, LLP

(57) ABSTRACT

A tracking circuit in a memory macro includes a data line, a first tracking cell, and a plurality of transistors. The first tracking cell is electrically coupled to the data line. The plurality of transistors is electrically coupled to the data line. The plurality of transistors is configured to cause a delay on a transition of a signal of the data line based on a delay current. The signal of the data line is configured for use in generating a signal of a control line of a memory cell of the memory macro.

20 Claims, 12 Drawing Sheets

TRACKING MECHANISMS

FIELD

The present disclosure is related to tracking mechanisms.

BACKGROUND

Because memory cells have different cell currents, memory cells have different read speed values. Some memory cells are "regular" or have an average read speed value. Some memory cells are faster than an average memory cell or have a read speed value lower than the average read speed value. A fast (faster) memory cell is commonly called a strong memory cell. In contrast, some memory cells are slower than the average memory cell or have a read speed value higher than the average read speed value. A slow (slower) memory cell is commonly called a weak memory cell. When a memory cell is accessed, a strong memory cell sinks and/or sources a higher current, while a weak memory cell sinks and/or sources a lower current. As a result, the read speed of a memory cell can be identified by the current sunk and/or sourced by the memory cell.

Tracking circuits in a memory macro are used to generate tracking or reference signals based on which signals for reading memory cells are generated. Ideally, the signals generated by the tracking circuits cover the condition of the weakest (or "weak") memory cells to be read. Generally, weak memory cells need relaxed access timing.

In an approach, the access timing for weak memory cells is simulated based on time delays of (logic) transistors manufactured by a logic manufacturing process, which is designed to manufacture transistors used in logic and/or control circuits. In contrast, a memory manufacturing process is designed to manufacture (memory) transistors used in memory devices. Generally, speed variations of logic transistors and of memory transistors do not correlate well. For example, in a memory macro, logic transistors may be fast while memory transistors may be slow or vice versa. As a result, in some conditions, accessing the weak memory cell with the time delays of logic transistors may not provide the desired timing.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
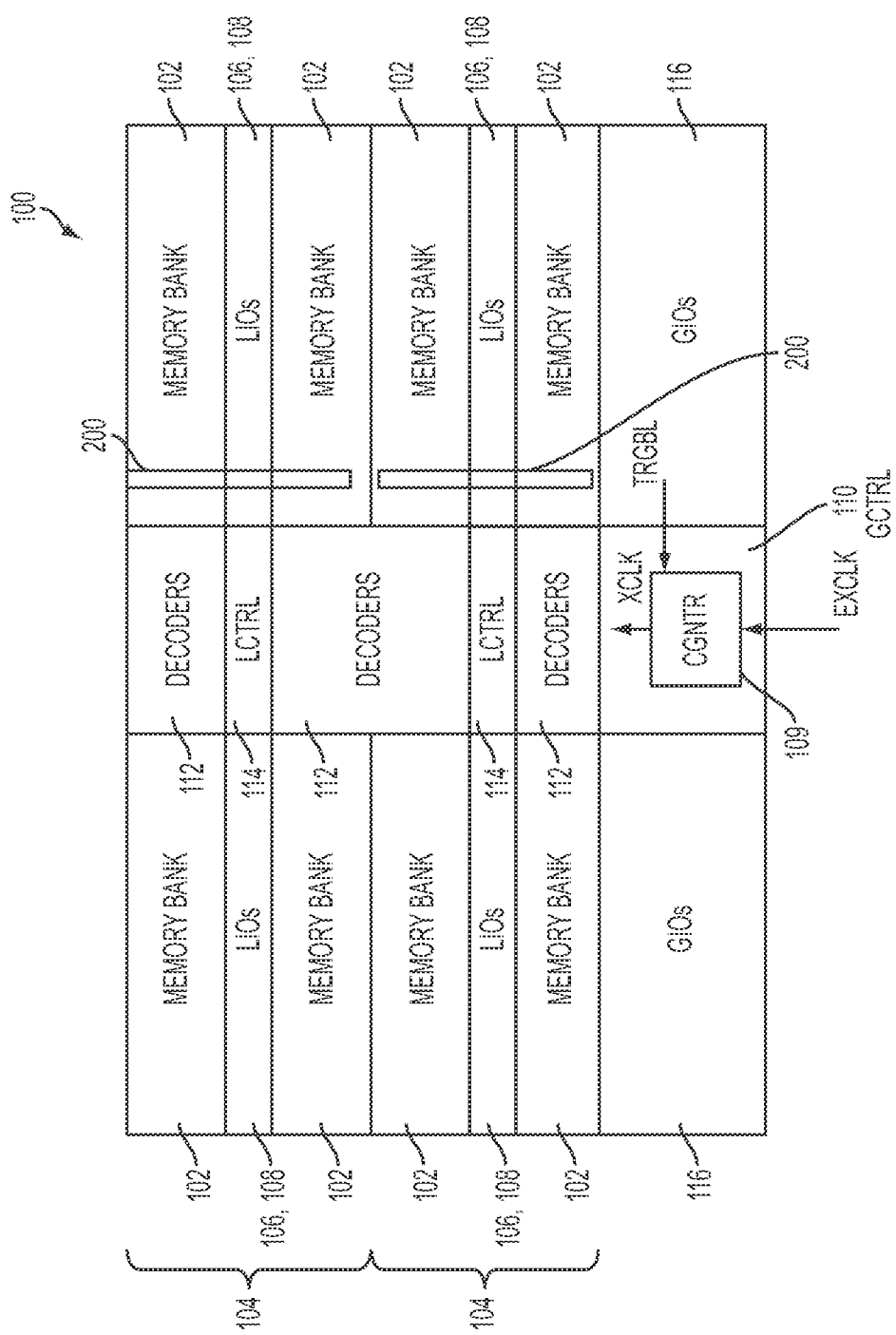
FIG. 1A is a block diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The time delay of a tracking read bit line in a tracking circuit is controlled to cover the timing for the weakest ("weak") bit cells. In some embodiments, a pull up circuit is used to control the falling transition from a high to a low logical value of the tracking read bit line in a tracking circuit. The pull up circuit includes a plurality of pull up transistors that make it harder for the tracking read bit line to fall from a high logical value to a low logical value. As a result, the falling transition of the tracking read bit line is delayed, which causes delays in the chain of signals that generate the read signal for a memory cell to be read. Effectively, the tracking circuit covers the read signals for the weak bit cells. The current driving capability of each of the pull up transistors affects the time delay and varies based on various factors such as the size, the threshold voltage value, the operational voltage value of each transistor.

Memory Macro

FIG. 1A is a block diagram of a static random access memory (SRAM) macro 100, in accordance with some embodiments. In this document "rise" refers to transitioning from a low logical value to a high logical value. "Fall" refers to transitioning from a high logical value to a low logical value.

Memory macro 100 is symmetrical. For example, with reference to decoders 112, local control circuits (LCTRLs) 114, and global control circuit (GCTRL) 110, circuit elements on the left side are similar to circuit elements on the right side of memory macro 100. Memory macro 100 includes a plurality of memory segments 104. Two memory segments 104 are shown for illustration. A different number of memory segments 104 is within the scope of various embodiments. Each segment 104 includes four memory banks 102, two memory banks on the left and two memory banks on the right. On each left and right side of memory macro 100, two memory banks 102 share a row of a plurality of local input/output circuits (LIO) 106 and 108. Different configurations of a memory segment are within the scope of various embodiments.

Each memory segment 104 also includes a tracking circuit 200. Two tracking circuits 200 are shown for illustration. Each memory bank 102 includes a plurality of memory cells 122 and a plurality of tracking cells 124 in a tracking circuit 200, which is described with reference to FIG. 2.

Address decoders 112 provide the X- or row-address of memory cells 122 to be accessed for a read or a write operation. For example, address decoders 112 determine the corresponding read word line of the accessed memory cell to be turned on based on the address of the accessed memory cell. In some embodiments, the address of the accessed memory cell is latched into GCTRL 110 based on a rising edge of clock EXCLK.

LCTRL 114 controls LIOs 106 and 108, including, for example, turning on and off the read word line and write word line of the memory cell to be read. For example, in some embodiments, based on a rising edge of a clock XCLK and the address of a memory cell to be read, LCTRL 114 generates a rising edge of a corresponding read word line of the memory cell to be read. Similarly, based on the falling edge of clock XCLK, LCTRL 114 generates a falling edge of the same read word line.

Global input/output (GIO) circuits 116 serve to transfer data between the memory cells and other circuits outside of memory macro 100.

GCTRL 110 provides the address pre-decode, clock, and other signals for memory macro 100. GCTRL 110 includes a Y-decoder (not shown) that provides the Y- or column address of a memory cell. GCTRL 110 controls the data transfer between memory cells 122 and circuits outside of memory macro 100.

Figure 3:
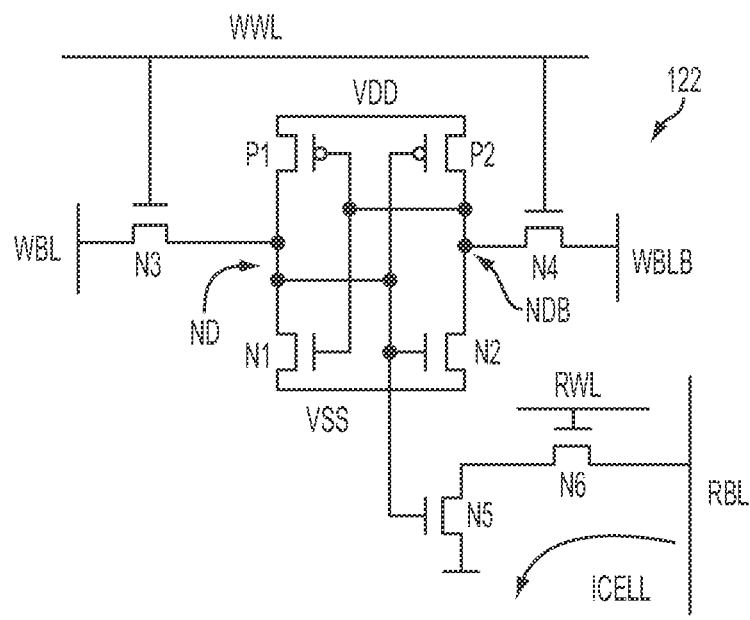
FIG. 3 is a circuit diagram of a memory cell, in accordance with some embodiments.
Figure 4:
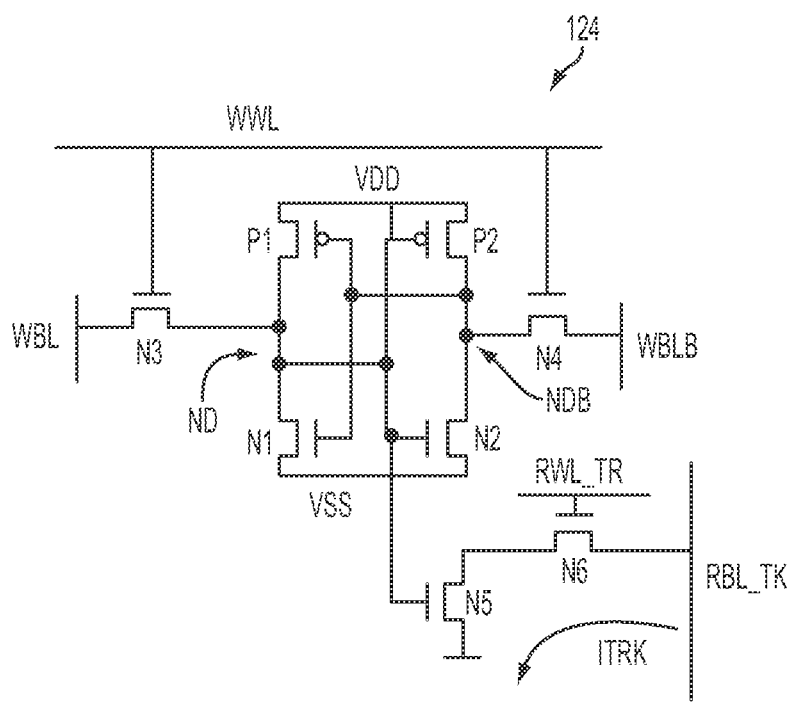
FIG. 4 is a circuit diagram of a tracking cell, in accordance with some embodiments.

Clock generator (CGNTR) 109 receives an external clock EXCLK and tracking global bit line TRGBL as inputs and generates an intermediate clock ICLK (not shown). Based on intermediate clock ICLK, clock generator 109 generates clock XCLK. Clock XCLK controls the read word line pulse widths of memory cells 122 and of tracking cells 124. Details of a memory cell 122 and a tracking cell 124 are shown in FIGS. 3 and 4, respectively.

Tracking global bit line TRGBL is generated based on clock XCLK. The transition of tracking global bit line TRGBL causes a transition in a reset signal, which is called a reset transition. In some embodiments, the reset is a low logical reset. That is, the reset transition is from a high logical value to a low logical value. A high logical reset is within the scope of various embodiments.

Memory Segment

Figure 1B:
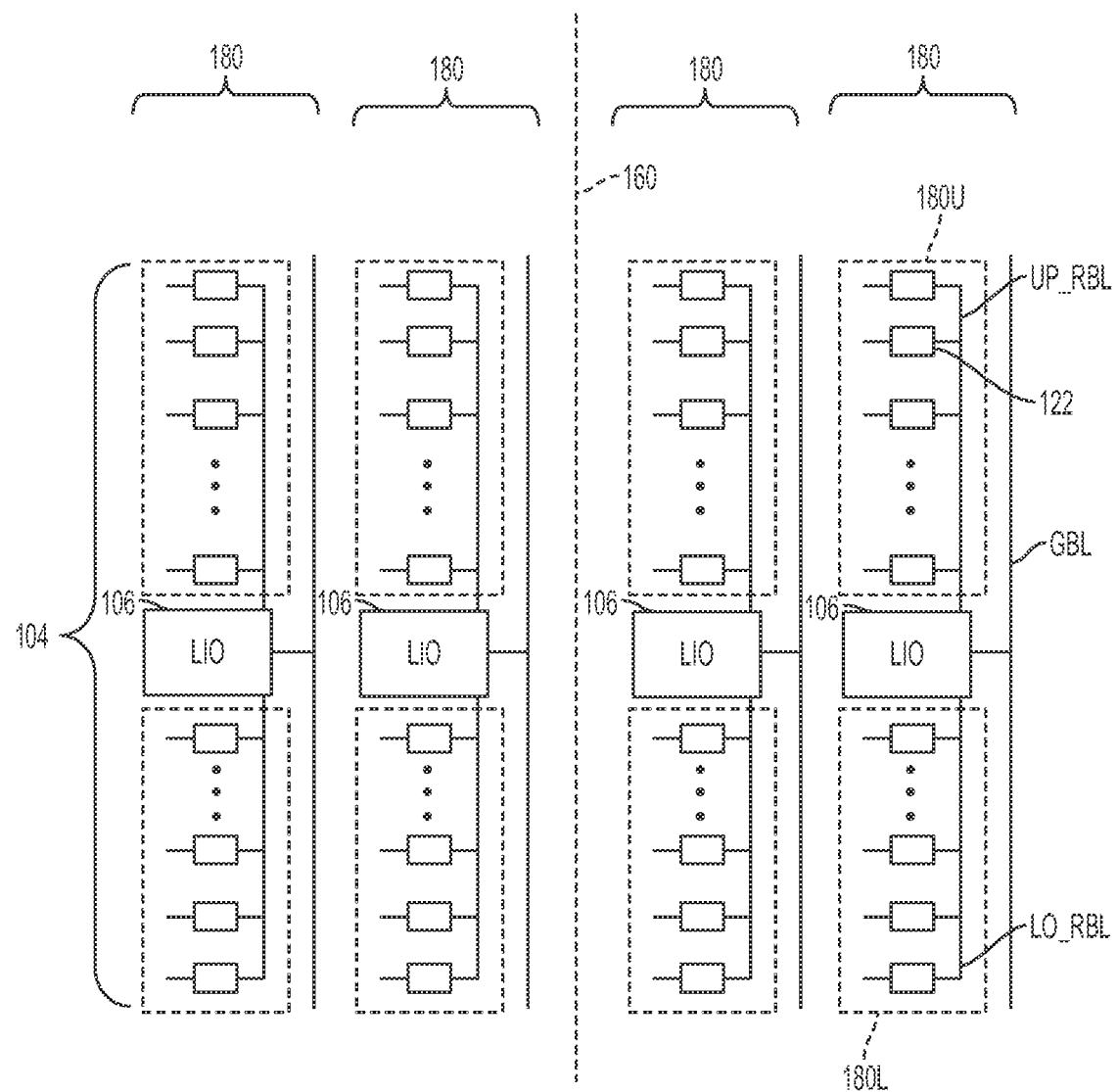
FIG. 1B is a diagram of a memory segment, in accordance with some embodiments.

FIG. 1B is a diagram of a memory segment 104, in accordance with some embodiments. A memory segment 104 includes a plurality of columns on the left and a plurality of columns of the right of memory macro 100. For illustration, FIG. 1B shows two columns 180 on the left and two columns 180 on the right of dotted line 160 used as a center reference. For simplicity, only elements of one column 180 on the right side are labeled.

Each column 180 includes LIO 106 coupling an upper column 180U and a lower column 180L. An upper column 180U includes a read bit line UP_RBL coupling a plurality of first memory cells 122. For simplicity, only one memory cell 122 is labeled. Similarly, a lower column 180L includes a read bit line LO_RBL coupling a plurality of second memory cells 122. In some embodiments, the number of first memory cells 122 in an upper column 180U is the same as the number of second memory cells 122 in a lower column 180L. In some embodiments, in a read operation, one memory cell 122 in an upper column 180U or in a lower column 180L is read.

Each column 180 also includes a global bit line GBL coupled to LIO 106. The global bit line GBL couples all LIOs 106 that are on the same column direction but belong to different segments 104. In some embodiments, the number of global bit lines GBL is the same as the number of columns of memory cells in memory macro 100. The number of global bit lines GBL different from the number of columns of memory cells is within the scope of various embodiments.

Figure 2:
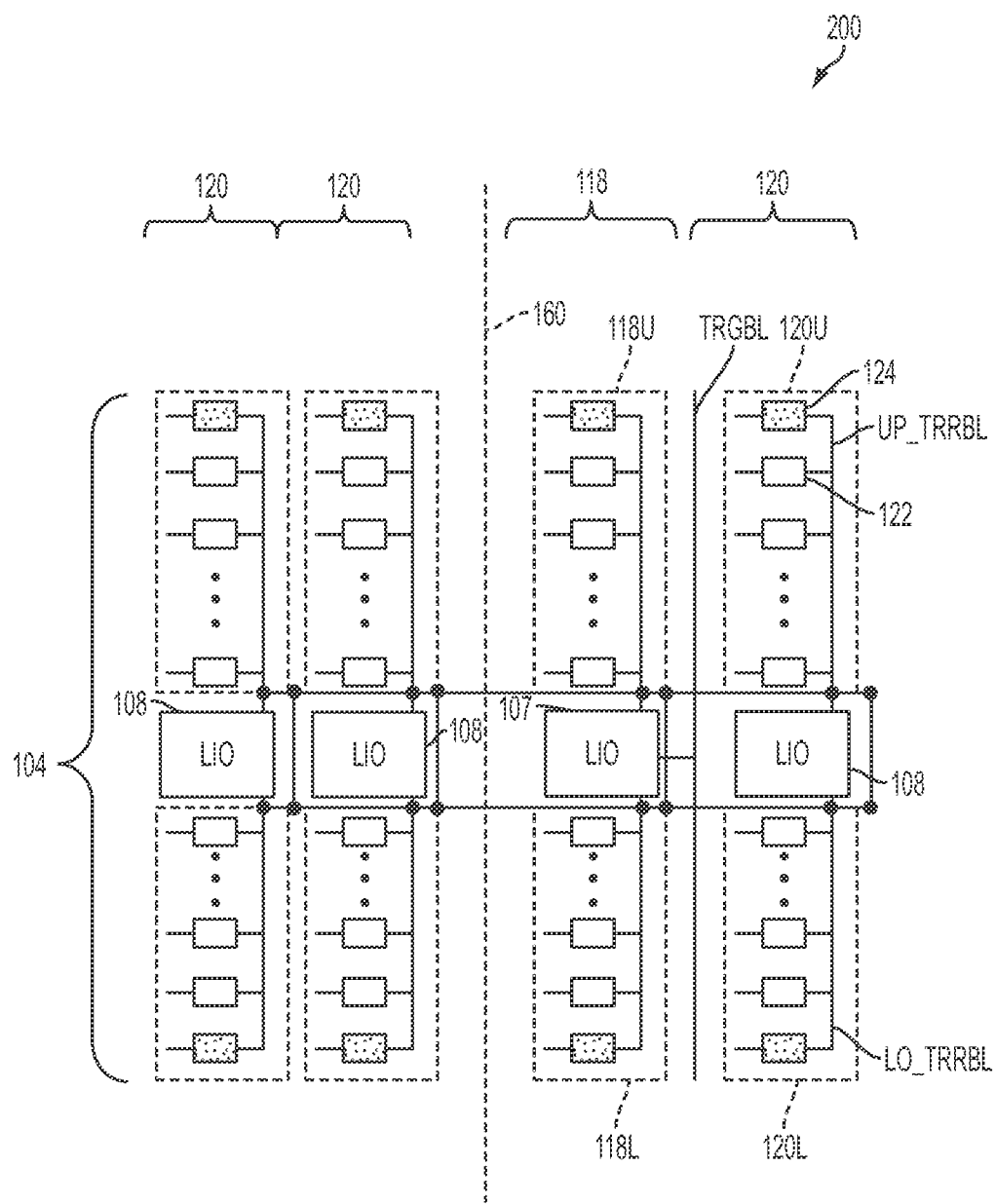
FIG. 2 is a diagram of a tracking circuit, in accordance with some embodiments.

In some embodiments, each segment 104 also includes a tracking circuit 200 detailed in FIG. 2.

Tracking Circuit

FIG. 2 is a diagram of various elements of a segment 104 illustrating a tracking circuit 200, in accordance with some embodiments.

Tracking circuit 200 includes one column 118 and three columns 120. Column 118 and column 120 are each a variation of column 180 of regular memory cells 122. Each column 120 includes one LIO 108 with a column 120U above the LIO 108 and a column 120L below the LIO 108. Each column 120U includes a plurality of memory cells 122 and one tracking cell 124 coupled to an upper tracking read bit line UP_TRRBL. Each column 120L includes a plurality of memory cells 122 and one tracking cell 124 coupled to a lower tracking read bit line LO_TRRBL. Column 118 includes one LIO 107 with a column 118U above the LIO 107 and a column 118L below the LIO 107. Column 118U includes a plurality of memory cells 122 and one tracking cell 124 coupled to an upper tracking read bit line UP_TRRBL. Column 118L includes a plurality of memory cells 122 and one tracking cell 124 coupled to a lower tracking read bit line LO_TRRBL.

For simplicity, one memory cell 122 of various memory cells 122 and one tracking cell 124 of eight tracking cells 124 are labeled. One column 120U of three columns 120U and one column 120L of three columns 120L are labeled. One upper tracking read bit line UP_TRRBL of four tracking read bit lines UP_TRRBL, and one lower tracking read bit line LO_TRRBL of four tracking read bit lines LO_TRRBL are labeled.

In some embodiments, upper tracking read bit lines UP_TRRBL and lower tracking read bit lines LO_TRRBL of all three columns 120 and of column 118 are coupled together. Upper tracking read bit lines UP_TRRBL, lower tracking read bit lines LO_TRRBL, and a tracking global bit line TRGBL are coupled to LIO 107 In FIG. 2, column 118 and one column 120 are on one right side of memory macro 100, and the other two columns 120 are on the left side of memory macro 100. In some embodiments, column 118 and columns 120 are selected adjacent to decoders 112 and local control circuitry LCTRL 114 in FIG. 1 to increase the speed of memory macro 100 and simplify the implementation of memory macro 100. Different locations of column 118 and/or columns 120 are within the scope of various embodiments. The relative locations of column 118 and 120 are within the scope of various embodiments. For example, two columns 120 and a combination of column 118 and column 120 may be next to one another as shown in FIG. 2, but column 118 and column 120 may be separated by one or a plurality of columns of regular memory cells 122.

Columns 120 are used to create the load for tracking circuit 200. Three columns 120 are used for illustrations, a different number of columns 120 used as a load is within the scope of various embodiments.

In some embodiments, for each segment 104, there is a corresponding tracking circuit 200. For example, memory macro 100 shown having two segments 104 has two tracking circuits 200. But if memory macro 100 has more than two segments 104, the number of tracking circuits 200 corresponds to the number of segments. Column 120 can be on the left side or on the right side of memory macro 100. In some embodiment, when memory cell 122 in one of the corresponding memory segment 104 is accessed, the corresponding tracking circuit 200 is turned on to generate tracking signals based on which read signals for the accessed memory cell 122 are generated.

In some embodiments, tracking global bit line TRGBL couples all LIOs 107 of tracking circuits 200 in a same column direction. In other words, a tracking global bit line TRGBL is shared by all tracking circuits 200 of memory macro 100. As a result, tracking global bit line TRGBL is coupled to a same number of LIOs 107 as a global bit line GBL. Tracking global bit line TRBGL coupling to a different number of LIOs 107 as a global bit line GBL is within the scope of various embodiments.

Memory Cell

FIG. 3 is a circuit diagram of a memory cell 122, in accordance with some embodiments. Memory cell 122 includes two P-type metal oxide semiconductor (PMOS) transistors P1 and P2, and six N-type metal oxide semiconductor (NMOS) transistors N1, N2, N3, N4, N5, and N6.

The gates of NMOS transistor N3 and N4 are coupled to a write word line WWL. Write word line WWL is coupled to each gate of transistors N3 and N4 of a plurality of memory cells 122 to a form a row of memory cells.

The gate of transistor N6 is coupled to a read word line RWL, which is commonly called a read control line. Read word line RWL is coupled to each gate of transistors N6 of the plurality of memory cells 122 that are coupled to a corresponding write word line WWL.

The drain of transistor N6 is coupled to a read bit line RBL. Read bit line RBL is coupled to each drain of a plurality of transistors N6 of a plurality of memory cells 122 to form a regular column 180U, 180L, a tracking column 118U, 118L, 120U, or 120L. If memory cell 122 is in a column 180U, read bit line RBL is called UP_RBL. But if memory cell 122 is in a column 180L, read bit line RBL is called LO_RBL. Similarly, if memory cell 122 is in a column 118U or a column 120U, read bit line RBL is called upper read bit line UP_TRRBL. But if memory cell 122 is in a column 118L or a column 120L, read bit line RBL is called lower read bit line LO_TRRBL.

The drains of transistors N3 and N4 are coupled to a pair of write bit lines WBL and WBLB, respectively. Write bit lines WBL and WBLB are coupled to each drain of transistors N3 and N4 of the plurality of memory cells 122 that are coupled to the corresponding read bit line RBL.

In a write operation for memory cell 122, write word line WWL is activated. The logical values to be written to memory cell 122 are placed at write bit lines WBL and WBLB, which are then transferred to and stored at nodes ND and NDB at the sources of transistors N3 and N4, respectively.

In a read operation, read word line RWL is activated to turn on transistor N6. Detecting the voltage value at read bit line RBL reveals the data stored in nodes NDB and ND. In some embodiments, the read data reflected on read bit line RBL is then transferred through LIO 106 to global bit line GBL, to GIOs circuit 116, and circuits outside of memory macro 100.

In some embodiments, prior to transistor N6 being turned on, read bit line RBL is charged to a high logical value. When transistor N6 is turned on, memory cell 122 sinks a current ICELL that flows from read bit line RBL or the drain of transistor N6 to the source of transistor N5 or ground. In effect, read bit line RBL is pulled from a high logical value to a low logical value. If memory cell 122 is strong, current ICELL is large and read bit line RBL is pulled to ground faster. But if memory cell 122 is weak, current ICELL is small and read bit line RBL is pulled to ground slower.

Tracking Cell

FIG. 4 is circuit diagram of a tracking cell 124, in accordance with some embodiments.

Tracking cell 124 includes circuit components similar to those of memory cell 122. Tracking read word line RWL_TK and tracking read bit line RBL_TK correspond to read word line RWL and read bit line RBL of memory cell 122, respectively. The gates of transistors P2, N2, and N5 in tracking cell 124 are configured to receive operational voltage VDD. As a result, PMOS transistor P2 is always off while NMOS transistors N2 and N5 are always on when voltage VDD is provided. Similar to memory cell 122, if tracking memory cell 124 is in a column 118U or a column 120U, read bit line RBL_TK is called upper read bit line UP_TRRBL. But if tracking cell 124 is in a column 118L or a column 120L, read bit line RBL_TK is called lower read bit line LO_TRRBL.

In some embodiments, when tracking read word line RWL_TK is activated, transistor N6 of tracking cell 124 is turned on. Transistors N5 and N6 sink current ITRK at the drain of transistor N6 to the source of transistor N5. A strong tracking cell 124 has a larger current ITRK while a weak tracking cell 124 has a smaller current ITRK.

LIOs

Figure 5:
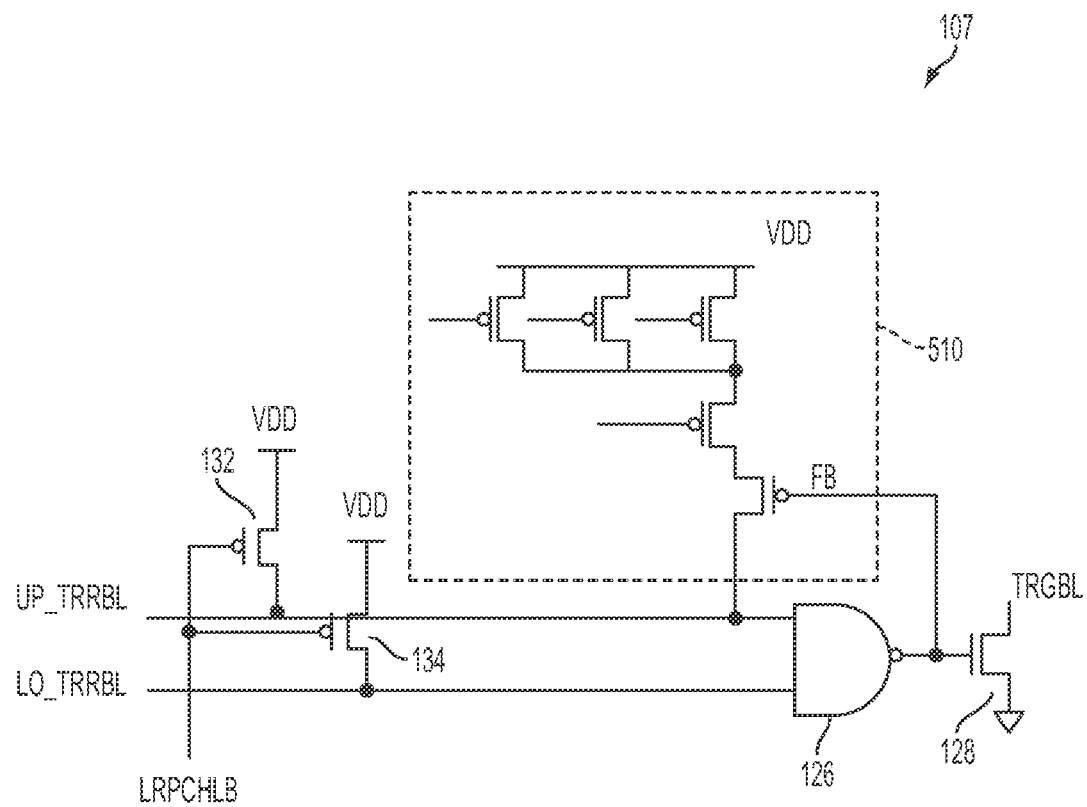
FIG. 5 is a circuit diagram of a local input/output (IO) circuit in the tracking circuit of FIG. 2, in accordance with some embodiments.

FIG. 5 is a circuit diagram of LIO 107 of tracking circuit 200 in FIG. 2, in accordance with some embodiments.

Each input of NAND gate 126 is coupled to an upper tracking read bit line UP_TRRBL and a lower tracking read bit line LO_TRRBL. In some embodiments as illustrated in tracking circuit 200 in FIG. 2, upper read bit line UP_TRRBL and lower read bit line LO_TRRBL are coupled together. The output of NAND gate 126 controls the gate of transistor 128, and, effectively, controls tracking global bit line TRGBL at the drain of transistor 128. Signal LRPCHB and transistors 132 and 134 are used to pre-charge upper tracking read bit line UP_TRRBL and lower tracking read bit line LO_TRRBL.

In tracking circuit 200, because upper tracking read bit line UP_TRRBL and lower tracking read bit line LO_TRRBL are coupled together, NAND gate 126 functions as an inverter. Further, upper tracking read bit line UP_TRRBL and lower tracking read bit line LO_TRRBL are referred to as tracking read bit line TRRBL. A circuit 510 controls the delay of tracking read bit line TRRBL, and will be explained in detail below with reference to FIG. 8A.

Figure 6:
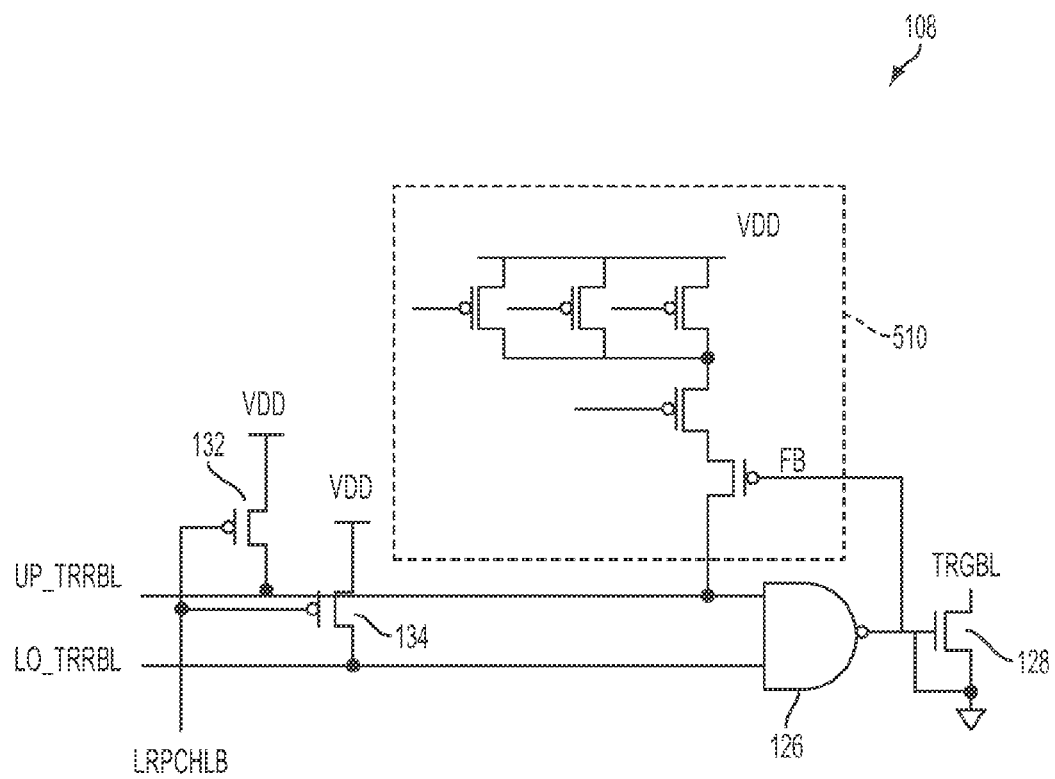
FIG. 6 is a circuit diagram of a tracking IO circuit, in accordance with some embodiments.

FIG. 6 is a circuit diagram of LIO 108 of tracking circuit 200 in FIG. 2, in accordance with some embodiments. LIO 108 includes circuit components similar to those of LIO 106 in FIG. 5. The output of NAND gate 126 in LIO 108, however, is not coupled to the gate of transistor 128. In contrast, the gate of transistor 128 is coupled to the source of transistor 128, which is ground or reference voltage VSS. As a result, transistor 128 is always off and acts as an open circuit.

Tracking Path

Figure 7A:
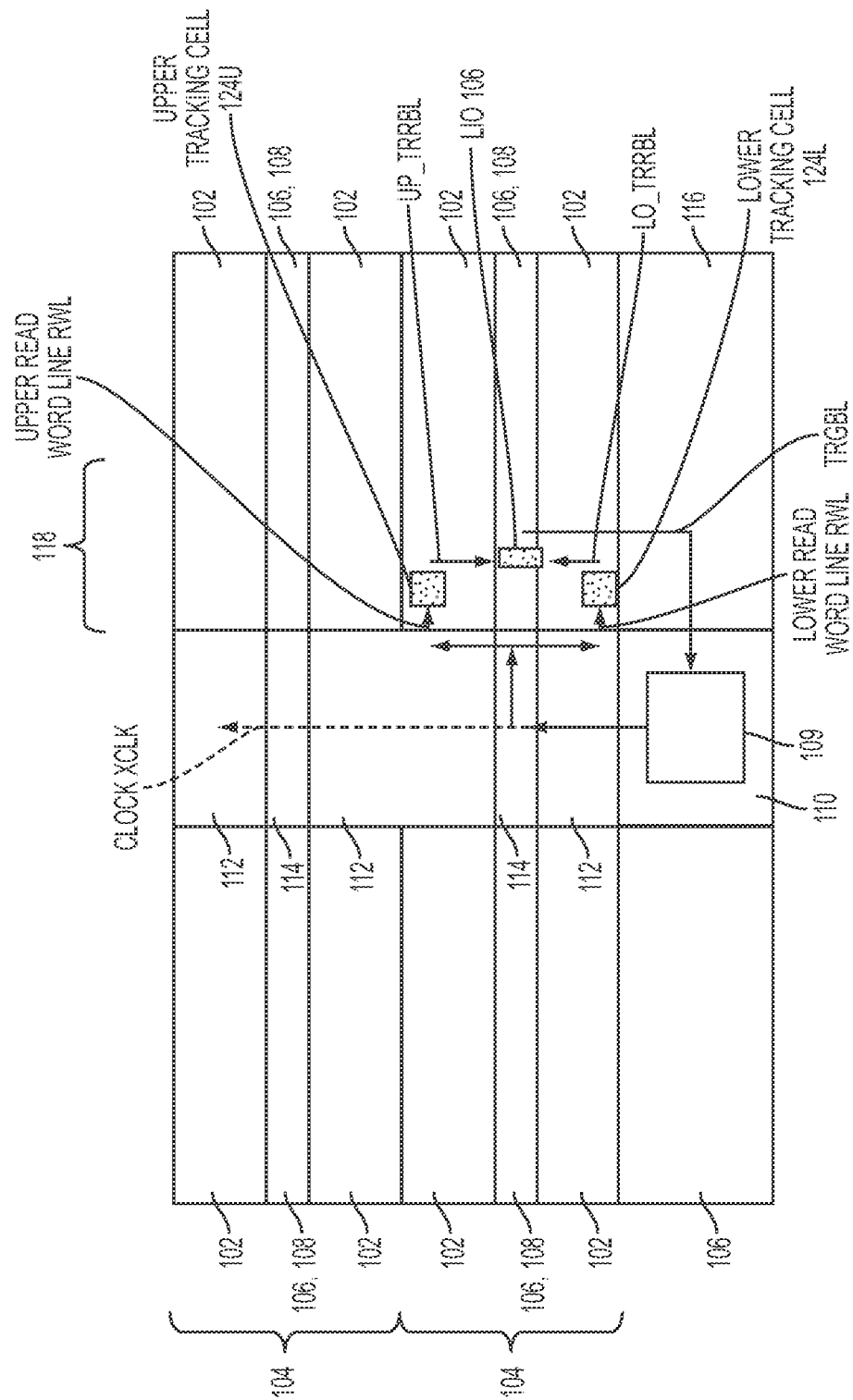
FIG. 7A is a diagram of a memory macro used to illustrate a tracking path, in accordance with some embodiments.

FIG. 7A is a block diagram of memory macro 100 used to illustrate a tracking path, in accordance with some embodiments. FIG. 7 shows an example of a tracking path of a circuit 200 for memory segment 104. The tracking path of another tracking circuit 200 for another segment 104 of memory macro 100 is similar and should be recognizable by persons of ordinary skill in the art in view of this document. In some embodiments, reading memory cell 122 in the corresponding segment 104 triggers the corresponding tracking circuit 200 and the tracking path as illustratively shown in FIG. 7A.

In some embodiments, tracking global bit line TRGBL transitions from a high logical value to a low logical value. The transition of tracking global bit line TRGBL is caused by an operation of tracking circuit 200 that includes one column 118 and three columns 120 illustratively shown in FIG. 2. For simplicity, some elements of column 118 in FIG. 2 are shown FIG. 7A, but three columns 120 in FIG. 2 are not shown in FIG. 7A. Effectively, the transition of tracking global bit line TRGBL is caused by the operations of an upper tracking cell 124 and a lower tracking cell 124 illustratively shown in FIG. 4. As a result, tracking read bit line RBL_TK of the upper tracking cell 124 and of the lower tracking cell 124 correspond to upper read tracking bit line UP_TRRBL and lower read tracking bit line LO_TRRBL of column 118U and column 118L, respectively. The transition of tracking global bit line TRGBL is also caused by the operations of LIO 107 coupled to upper tracking read bit line UP_TRRBL and lower tracking read bit line LO_TRRBL. The detail of LIO 107 is illustratively described with reference to FIG. 5. In some embodiments, upper tracking read bit line UP_TRRBL, lower tracking read lit line LO_TRRBL, and global tracking bit line TRGBL are initially pre-charged to a high logical value.

In some embodiments, a rising edge of clock EXCLK causes clock XCLK to rise. Once the rising edge of clock XCLK is generated, clock XCLK is then transmitted from clock generator 109 through one or various decoders 112 and local control circuitry LCTRL 114 to a corresponding segment 104 that includes memory cell 122 to be read. Based on the rising edge of clock XCLK, LCTRL 114 corresponding to the memory cell 122 to be read causes a corresponding read word line RWL of memory cell 122 to be read to rise. The data at node ND or the gate of transistor N5 of the memory cell 122 to be read is reflected on the corresponding read bit line RBL. Through a corresponding local LIO 106 coupling the read bit line RBL and global bit line GBL, the data to be read is transferred from read bit line RBL to the corresponding global bit line GBL, which is then transferred to global IO circuit 116, and to other circuits outside of memory macro 100.

The rising edge of clock XCLK is also transmitted to a corresponding tracking circuit 200 of a corresponding segment 104 that includes the memory cell 122 to be read. Clock XCLK is then used to activate the upper tracking read word line RWL_TK (shown in FIG. 4) and the lower tracking read word line RWL_TK of the respective upper tracking cell 124 and the lower tracking cell 124 of tracking circuit 200. For example, in some embodiments, a high logical value of clock XCLK causes transistors N6 of upper tracking cell 124 and of lower tracking cell 124 to turn on. Upper tracking read bit line UP_TRRBL and lower tracking read bit line LO_TRRBL are pulled to ground or a low logical value at the source of transistors N5 of upper tracking cell 124 and of lower tracking cell 124. NAND gate 126 of LIO 107 illustrated in FIG. 5 receives a low logical value of upper tracking read bit line UP_TRRBL and of lower tracking read bit line LO_TRRBL at both inputs. As a result, output of NAND gate 126 at the gate of transistor 128 has a high logical value, which turns on NMOS transistor 128. Because transistor 128 is turned on, tracking global bit line TRGBL is pulled to reference voltage VSS or a low logical value at the source of transistor 128. Effectively, global tracking bit line TRGBL transitions from a high logical value to a low logical value. In some embodiments, global tracking bit line TRGBL is fed to clock generator 109, and causes a tracking reset signal TRRSET (not shown) to also transition from a high to a low logical value. In this document, a reference to the high to low transition of global tracking bit line TRGBL also refers to the high to low transition of tracking reset signal TRRSET.

In some embodiments, the falling edge of tracking global bit line TRGBL causes clock XCLK to fall. The falling edge of clock XCLK then travels through one or a plurality of decoders 112 and local control circuitry LCTRL 114 to the segment 104 having the memory cell 122 to be read. A corresponding LCTRL 114, based on the falling edge of clock XCLK, causes the falling edge of the corresponding read word line RWL of the memory cell to be read. The LCTRL 114 also causes the rising edge of the corresponding RBL.

Waveforms for Tracking Signals

Figure 7B:
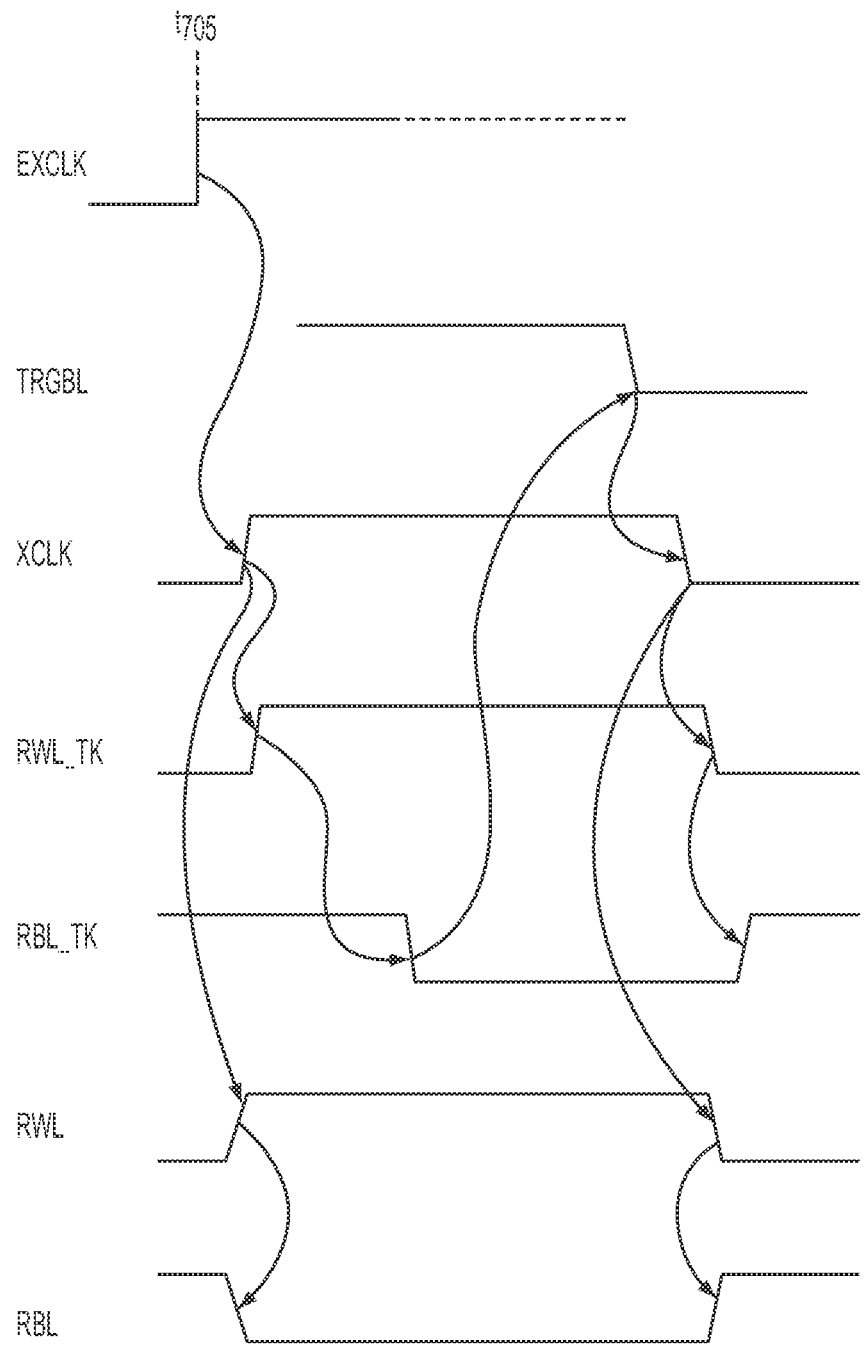
FIG. 7B is a graph of waveforms illustrating the relationships of various signals, in accordance with some embodiments.

FIG. 7B is a graph of waveforms illustrating the relationships of various signals, in accordance with some embodiments.

At time t705, a rising edge of clock EXCLK causes clock XLCK to rise.

The rising edge of clock XCLK causes the tracking read word lines RWL_TK of tracking cells 124 of tracking circuit 200 and the read word line RWL of the memory cell 122 to be read to rise.

The rising edge of read word line RWL of the memory cell 122 to be read causes read bit line RBL of the memory cell 122 to be read to fall.

The rising edge of tracking read word lines RWL_TK causes tracking read bit lines RBL_TK of tracking cells 124 of tracking circuit 200 to fall.

The falling edge of tracking read bit lines RBL_TK causes tracking global bit line TRGBL to fall.

The falling edge of tracking global bit line TRGBL causes clock XCLK to fall.

The falling edge of clock XCLK causes tracking read word lines RWL_TK of tracking cells 124 of tracking circuit 200 and read word line RWL of the memory cell 122 to be read to fall.

The falling edge of tracking read word lines RWL_TK causes tracking read bit lines RBL_TK to rise.

The falling edge of read word line RWL of the memory cell 122 to be read causes read bit line RBL of the memory cell 122 to be read to rise.

Controlling the Delay of Tracking Read Bit Line

Figure 8A:
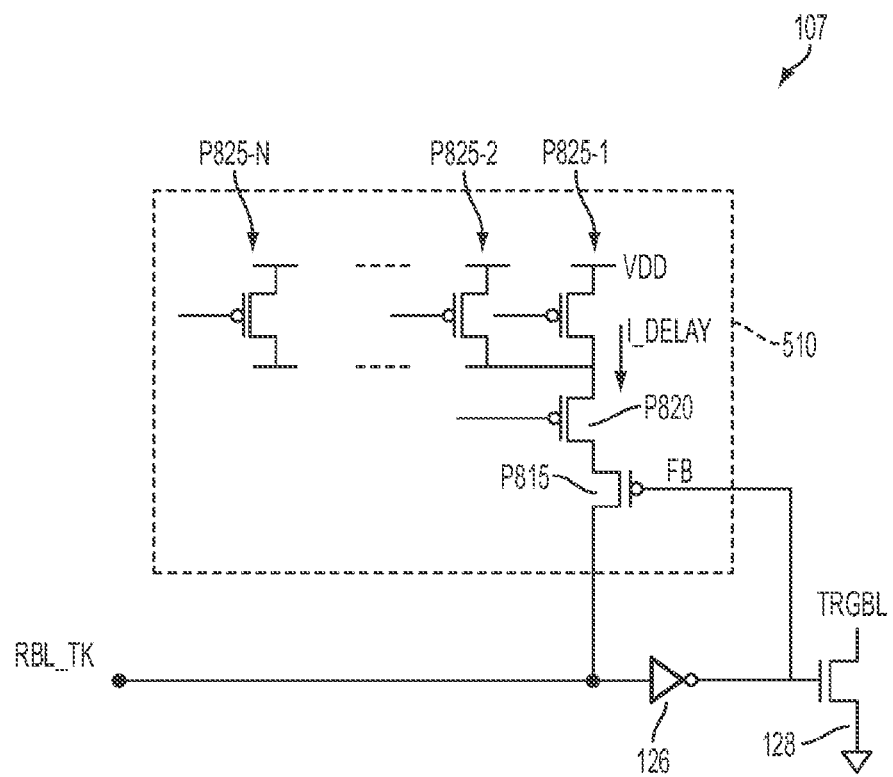
FIG. 8A is a diagram of a local IO used to illustrate how the delay of a tracking read bit line is controlled, in accordance with some embodiments.

FIG. 8A is a diagram of LIO 107 used to illustrate how the delay of a tracking read bit line RBL_TK is controlled, in accordance with some embodiments. Upper tracking read bit line UP_TRRBL and lower tracking read bit line LO_TRRBL in FIG. 2 that are coupled together are shown as one tracking read bit line RBL_TK. For illustration, an inverter 126 is shown in place of NAND gate 126 in FIG. 5 that functions as an inverter. Further, for simplicity, the precharge circuit that includes transistors 132 and 134 in FIG. 5 are not shown.

In some embodiments, tracking read bit line RBL_TK is charged to a high logical value before a read cycle. When tracking read word line RWL_TK of tracking cell 124 is activated, transistor N6 in tracking cell 124 in FIG. 4 pulls tracking read bit line RBL_TK to a low logical value at the source of transistor N5. Effectively, tracking read bit line RBL_TK falls from a high to a low logical value.

Circuit 510 causes an additional delay to the falling transition of tracking read bit line RBL_TK. In other words, the falling edge of tracking read bit line RBL_TK is delayed. As a result, the falling edges of global tracking bit line TRRBL (FIG. 7B), of clock XCLK, and of read word line RWL of a memory cell to be read are delayed. Consequently, tracking circuit 200 causes a larger pulse width for the read word line RWL used by the memory cell to be read. Explained in another way, tracking circuit 200 covers the read timing of the weak bit cells.

PMOS transistor P820 functions as a switch to electrically connect and disconnect transistors P825-1, P825-2, . . . , P825-N from transistor P820 and thus tracking read bit line RBL_TK. For illustration, in the below description, transistor P820 is on to electrically connect transistors P825 to tracking read bit line RBL_TK. Other switching circuits used in place of PMOS transistor P820 are within the scope of various embodiments.

PMOS transistor P815 serves to cut off the effect of transistors P825-1, P825-2, . . . , P-825-N when a transition of tracking read bit line RBL_TK crosses the trip point threshold VTRIP (not labeled) of inverter 126. For example, when tracking read bit line RBL_TK is logically high, signal FB at the output of inverter 126 is logically low. Signal FB is also fed to the gate of PMOS transistor P815. As a result, PMOS transistor P815 is turned on. Consequently, transistors P825-1, P825-2, . . . , P825-N are electrically connected to tracking read bit line RBL_TK and cause a delay to tracking read bit line RBL_TK. But when tracking read bit line RBL_TK transitions to a low logical value and crosses trip point VTRIP, signal FB rises to be logically high. As a result, transistor P815 is off, electrically disconnecting transistors P825-1, P825-2, . . . , P825-N from tracking read bit line RBL_TK. Transistor P815 is commonly called a feedback transistor.

Transistors P825-1, P825-2, . . . , P825-N add a delay to the transition of tracking read bit line RBL_TK from a high to a low logical value. N number of transistors P825-1 to P825N are shown for illustration, wherein N is an integer number. In some embodiments, transistors P825-2 to P825-N are additional transistors added to an existing circuit to cause the total delay to tracking read bit line RBL_TK. Transistors P825-1, P825-2, . . . , P825-N are shown coupled in parallel because the sources of transistors P825-1, P825-2, . . . , P825-N are electrically coupled together (and to operational voltage VDD) while the drains of transistors P825-1, P825-2, . . . , P825-N are coupled together (and to the source of transistor P820). Transistors P825-1, P825-2, . . . , P825-N coupled in various combinations of a parallel connection and a series connection are within the scope of various embodiments. Two transistors are coupled in series when a drain of a first transistor is coupled to a source of a second transistor. For illustration, transistors P815 and P820 are on. As a result, transistors P825-1, P825-2, . . . , P825-N are electrically connected to tracking read bit line RBL_TK. Transistors P825-1, P825-2, . . . , P825-N function as "pull-up" devices. For example, transistors P825-1, P825-2, . . . , P825-N attempt to pull tracking read bit line RBL_TK to operational voltage VDD at the sources of transistors P825-1, P825-2, . . . , P825-N. As a result, when tracking read bit line RBL_TK is falling from a high to a low logical value, transistors P825-1, P825-2, . . . , P825-N make it harder for tracking read bit line RBL_TK to fall. Explained in another way, transistors P825-1, P825-2, . . . , P825-N cause a delay in the falling transition of tracking read bit line RBL_TK.

In some embodiments, transistors P825-1, P825-2, . . . , P825-N are configured to provide a desired delay based on the driving capability of each of transistor P825-1, P825-2, . . . , P825-N, which is proportional to the amount of current I_DELAY sourced by transistors P825-1, P825-2, . . . , P825-N. A transistor is called "strong" or has a greater driving capability when the transistor sources a larger current. In contrast, a transistor is "weak" or has a lesser driving capability when the transistor sources a smaller current.

In some embodiments, the driving capability of each transistor P825-1, P825-2, . . . , or P825-N and thus the amount of delay caused to tracking read bit line RBL_TK are considered based on various factors, including, for example, the size of each transistor P825-1, P825-2, . . . , P825-N, the threshold voltage of each transistor P825-1, P825-2, . . . , P825-N, and the operational voltage of each transistor P825-1, P825-2, . . . , P825-N. For example, a transistor P825-1, P825-2, . . . , or P825-N is configured to have a larger length and/or width to have a greater driving capability or to provide a larger current, resulting in a larger current I_DELAY, which corresponds to a larger time delay. In contrast, a transistor P825-1, P825-2, . . . , or P825-N is configured to have a smaller length and/or width to have a smaller current, resulting in a smaller current I_DELAY, which corresponds to a smaller time delay.

For another example, a transistor P825-1, P825-2, . . . , or P825-N is configured to have a lower voltage threshold to provide a higher current I_DELAY and thus a larger time delay. In contrast, a transistor P825-1, P825-2, . . . , or P825-N is configured to have a higher voltage threshold to provide a lower current I_DELAY and thus a smaller time delay.

For another example, a transistor P825-1, P825-2, . . . , or P825-N is configured to have a higher operational voltage VDD to provide a higher current I_DELAY and thus a larger time delay. In contrast, a transistor P825-1, P825-2, . . . , or P825-N is configured to have a lower operational voltage VDD to provide a lower current I_DELAY and thus a smaller time delay.

In the above description, a transistor P8251, P825-2, . . . , or P825-N is used for illustration, the plurality of transistors P8251, P825-2, . . . , P825-N are used to provide the total current I_DELAY and to have a total delay effect. The higher the number of transistors P825 is used, the larger the current I_DELAY and the larger the time delay result. But the smaller the number of transistors P8251, P825-2, . . . , P825-N is used, the lower the current I_DELAY and thus the smaller the time delay result. Further, a current source or other circuitry sourcing current I_DELAY in place of transistors P8251, P825-2, . . . , P825-N are within the scope of various embodiments.

Additionally, each of the size, the threshold voltage, and the operational voltage that is individually explained in the above paragraphs is for illustration. The current I_DELAY provided by circuit 510 is considered based on one or a combination of the size, the threshold voltage, and the operational voltage of one or a plurality of transistors P8251, P825-2, . . . , P825-N.

In some embodiments, switching transistor P820 and feedback transistor P815 affect the delay on tracking read bit line RBL_TK. The current provided by transistors P820 and P815 are also considered with current I_DELAY as the total current provided by circuit 510 to tracking read bit line RBL_TK. For simplicity and illustration, the total current I_DELAY provided by transistors P8251, P825-2, ..., P825-N is considered the current provided by circuit 510.

Figure 8B:
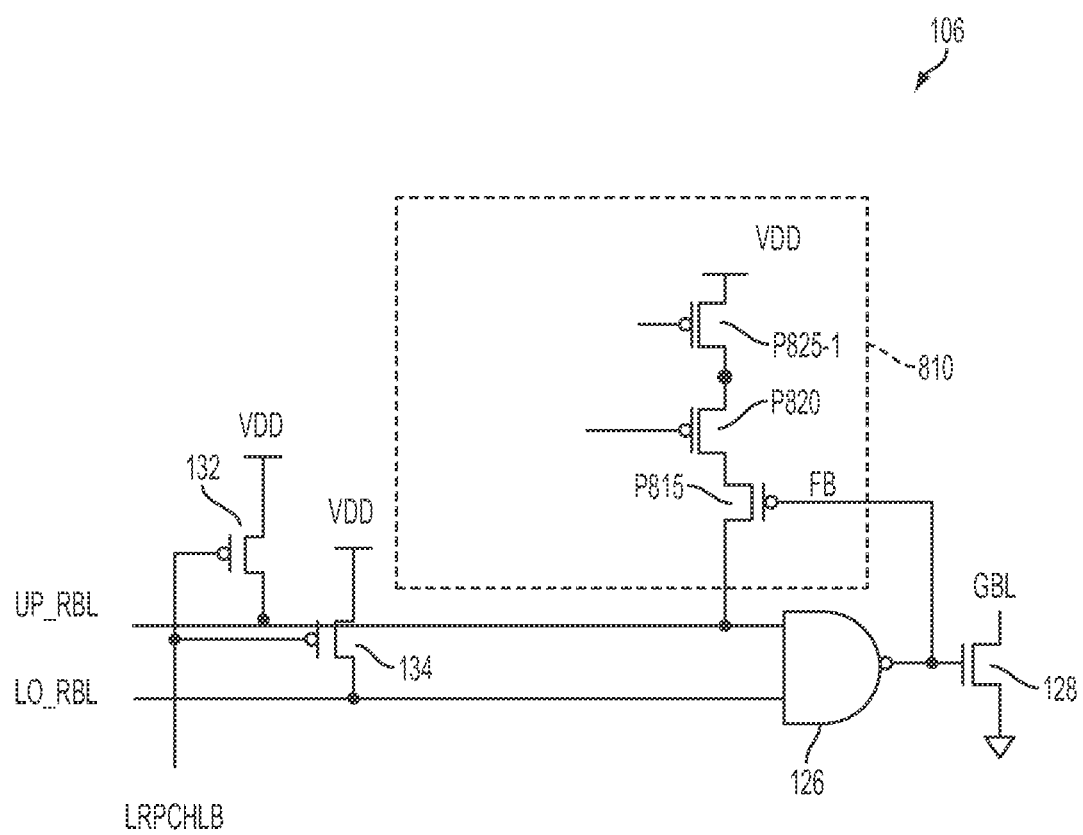
FIG. 8B is a circuit diagram of a local IO in a column of FIG. 1B, in accordance with some embodiments.

FIG. 8B is a circuit diagram of LIO 106 in FIG. 1B, in accordance with some embodiments. Compared with LIO 107 in FIG. 5, LIO 106 includes similar circuit components as in LIO106. Circuit 810 in FIG. 8B, however, is different from circuit 510 in FIG. 5 and in FIG. 8A. For example, circuit 810 does not have transistors P825-2 to P825-N as in circuit 510 in FIG. 8A. Further, upper read bit line UP_RBL, lower read bit line LO_RBL, and global bit line GBL correspond to upper tracking read bit line UP_TRRBL, lower tracking read bit line LO_TRRBL, and tracking global bit line TRGBL in FIG. 5, respectively. Operation of LIO 106 in column 180 in FIG. 1B is similar to operation of LIO 107 in column 118 in FIG. 2, and should be recognizable by persons of ordinary skill in the art.

Tracking Current and Current of Weak Bit Cells

In some embodiments, at a particular operational voltage value VDD, the average current I_TRACKING (not labeled) of all tracking cells 124 in a tracking circuit 200 is calculated. For example, current I_TRACKING_TOTAL (not labeled) sunk by all tracking cells 124 in circuit 200 is determined. Current I_TRACKING_TOTAL is the sum of each current ITRK sunk by each tracking cell 124 in circuit 200. In some embodiments, current I_TRACKING_TOTAL is determined by a circuit simulation. Current I_TRACKING is then obtained by dividing current I_TRACKING_TOTAL by the number of tracking cells 124 in tracking circuit 200. In some embodiments, tracking circuit 200 is designed to provide current I_TRACKING that corresponds to the average current ICELL of memory cells 122 in memory macro 100.

In some embodiments, a value of current I_WEAK of the weakest cell of all memory cells 122 in memory macro 100 is determined at a particular voltage value VDD. Further, the value of current I_WEAK is determined based on the 6-sigma value of a plurality of values of current ICELL of memory cells 122. For example, a model simulation is performed to determine the values of current ICELL of all memory cells 122 in memory macro 100. Based on the values of current ICELL, the 6-sigma value is calculated and considered as the value for current I_WEAK. The 6-sigma value calculation is not described, but should be recognizable by persons of ordinary skill in the art.

Different ways of determining the value for current I_WEAK are within the scope of various embodiments. For example, in some embodiments, the 6-sigma value in addition to the values of current ICELL of memory cells 122 is also based on the values of current ITRK of tracking cells 124. This is because, as illustrated in FIGS. 3 and 4, a memory cell 122 and a tracking cell 124 have similar circuit elements. For another example, in some embodiments, a different sigma value, such as the 5-sigma, 4-sigma, 3-sigma, 2-sigma, 1-sigma, etc., instead of the 6-sigma value, is used to determine a value of current I_WEAK.

Determining Current I Delay

Figure 9:
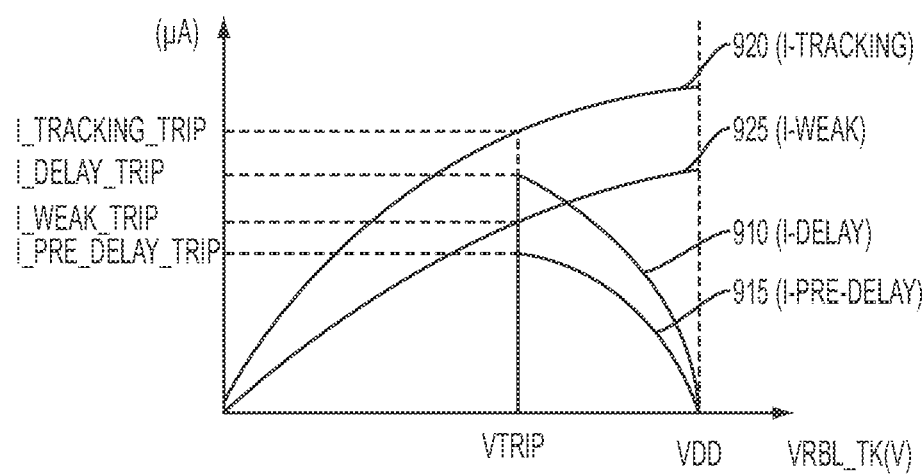
FIG. 9 is a graph of waveforms used to illustrate how a current provided to a tracking read bit line is determined, in accordance with some embodiments.

FIG. 9 is a graph of waveforms used to illustrate how current I_DELAY is determined, in accordance with some embodiments. For illustration, the X-axis is in a voltage unit such as volts (V) while the Y-axis is in a current unit such as micro-amperes (μA). The operational voltage VDD for circuit 100 is 0.9 V. Voltage VRBL_TK is the voltage on tracking read bit line RBL_TK, and varies from 0 V to voltage VDD. Line 910 represents the relationship between current I_DELAY and voltage VRBL_TK. When voltage VRBL_TK is at operational voltage VDD, current I_DELAY is at 0 μA because the voltage dropped between the sources of transistors P8251, P825-2, ..., P825-N and tracking read bit line RBL_TK is 0 V. When voltage VRBL_TK decreases, current I_DELAY starts flowing and increases. When voltage VRBL_TK decreases just past the trip point VTRIP of inverter 126, signal FB is logically high, and transistor P815 is turned off. As a result, current I_DELAY drops to 0 μA.

Line 915 represents the relationship between current I_PRE_DELAY and voltage VRBL_TK. In some embodiments, current I_PRE_DELAY is the current provided to tracking read bit line RBL_TK without additional transistors P825-2 to P825-N. The shape of line 915 is similar to the shape of line 910, but current I_PRE_DELAY is smaller than current I_DELAY for each value of voltage VRBL_TK between the trip point VTRIP and the operational voltage VDD. Similar to current I_DELAY, when voltage VRBL_TK is at operational voltage VDD, current I_PRE_DELAY is 0 μA because the voltage dropped between the sources of transistors P825 and tracking read bit line RBL_TK is 0 V. When voltage VRBL_TK decreases, current I_PRE_DELAY starts flowing and increases. When voltage VRBL_TK decreases just past the trip point VTRIP of inverter 126, signal FB is logically high, and transistor P815 is turned off. As a result, current I_PRE_DELAY drops to 0 μA.

Line 920 represents the relationship between current I_TRACKING and voltage VRBL_TK. Current I_TRACKING is the average of current ITRK of tracking cells 124 of tracking circuit 200 as explained above. When voltage VRBL_TK is at operational voltage VDD, current I_TRACKING is at a corresponding value (not labeled). When voltage VRBL_TK decreases, current I_TRACKING decreases. Eventually, current I_TRACKING drops to 0 μA when voltage VRBL_TK is at 0 V.

Line 925 represents the relationship between current I_WEAK and voltage VRBL_TK. When voltage VRBL_TK is at operational voltage VDD, current I_WEAK is at a corresponding value (not labeled). When voltage VRBL_TK decreases current I_WEAK decreases. Eventually, current I_WEAK drops to 0 μA when voltage VRBL_TK is at 0 V. Generally, current I_WEAK is smaller than current I_TRACKING at each voltage value of voltage VRBL_TK above 0 V.

In some embodiments, trip point VTRIP is determined to be about 60%-70% of operational voltage VDD. Further, trip point VTRIP is the voltage of tracking read bit line VRBL_TK at which current I_TRACKING is larger than current I_DELAY so that tracking read bit line RBL_TK is pulled to the low logical value. Those of ordinary skill in the art will recognize that if current I_TRACKING is smaller than current I_DELAY, tracking read bit line RBL_TK will not transition completely to a low logical value.

In some embodiments, when voltage VRBL_TK is at trip point VTRIP, current I_DELAY is designed such that the difference ΔI1 between current I_TRACKING and current I_DELAY is a predetermined value. For illustration, current value I_TRACKING_TRIP is the value of current I_TRACKING when tracking read bit line RBL_TK is at trip point VTRIP. Similarly, current I_DELAY_TRIP is the value of current I_DELAY when tracking read bit line RBL_TK is at trip point VTRIP.

Mathematically:

$$\Delta I1 = I\_TRACKING\_TRIP - I\_DELAY\_TRIP$$

Further, when voltage VRBL_TK is at trip point VTRIP, current I_WEAK is designed such that the difference ΔI2 between current I_WEAK and current I_PRE_DELAY is a predetermined valued. For illustration, current value I_WEAK_TRIP is the value of current I_WEAK when voltage VRBL_TK of tracking read bit line RBL_TK is at trip point VTRIP, and current value I_PRE_DELAY_TRIP is the value of current I_PRE_DELAY when voltage VRBL_TK is at trip point VTRIP.

Mathematically:

$$\Delta I2 = I\_WEAK\_TRIP - I\_PRE\_DELAY\_TRIP$$

In some embodiments, $$\Delta I1 = \Delta I2 \text{ or}$$

$$I\_WEAK\_TRIP - I\_PRE\_DELAY\_TRIP = I\_TRACKING\_TRIP - I\_DELAY\_TRIP \text{ or}$$

$$I\_DELAY\_TRIP = I\_TRACKING\_TRIP - I\_WEAK\_TRIP + I\_PRE\_DELAY\_TRIP \quad (1) \text{ or}$$

$$I\_TRACKING\_TRIP - I\_WEAK\_TRIP = I\_DELAY\_TRIP - I\_PRE\_DELAY\_TRIP$$

In some embodiments, line 920 of current I_TRACKING, line 925 of current I_WEAK, and line 915 of current I_PRE_DELAY are obtained through simulation. Base on each of the respective line 920, 925, and 915, the values I_TRACKING_TRIP, I_WEAK_TRIP, and I_PRE_DELAY_TRIP are obtained, and the value I_DELAY_TRIP is determined based on equation (1) above.

The relationships between various currents and voltage VRBL_TK based on lines 910, 915, 920, and 925 are for illustration. Different ways of determining the relationships, such as a mathematical equation, are within the scope of various embodiments.

In some embodiments, one or a plurality of transistors P8251, P825-2, ..., P825-N is selected and configured to have a particular size, a particular threshold voltage, and/or a particular operational voltage to provide the desired value of current I_DELAY_TRIP.

Exemplary Method

Figure 10:
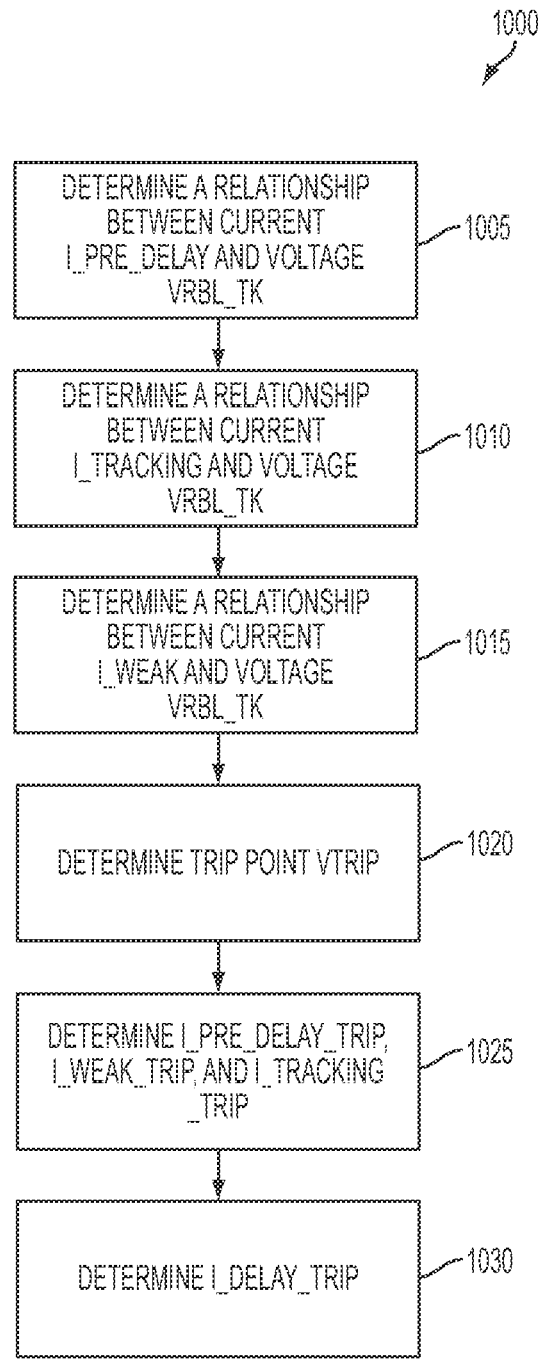
FIG. 10 is a flowchart of a method illustrating how the current provided to a tracking read bit line is determined, in accordance with some embodiments.

FIG. 10 is a flowchart of a method 1000 illustrating how current I_DELAY provided by circuit 510 to tracking read bit line RBL_TK is determined, in accordance with some embodiments.

In step 1005, a relationship between current I_PRE_DELAY and voltage VRBL_TK is determined. In some embodiments, line 915 is obtained.

In step 1010, a relationship between current I_TRACKING and voltage VRBL_TK is determined. In some embodiments, line 920 is obtained.

In step 1015, a relationship between current I_WEAK and voltage VRBL_TK is determined. In some embodiments, line 925 is obtained.

In step 1020, trip point VTRIP is determined. In some embodiments, trip point VTRIP is determined to be a certain percentage of operational voltage VDD, such as about 60% to 70% of operational voltage VDD.

In step 1025, each of the values I_PRE_DELAY_TRIP, I_WEAK_TRIP, and I_TRACKING_TRIP is determined.

In step 1030, the value I_DELAY_TRIP is determined based on the values of I_PRE_DELAY_TRIP, I_WEAK_TRIP, and I_TRACKING_TRIP, based on equation (1) above.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level of various signals used in the above description is also for illustration. Various embodiments are not limited to a particular level when a signal is activated and/or deactivated. Selecting different levels is within the scope of various embodiments.

In some embodiments, a tracking circuit in a memory macro comprises a data line, a first tracking cell, and a plurality of delay transistors. The first tracking cell is electrically coupled to the data line. The plurality of delay transistors is electrically coupled to the data line. The plurality of delay transistors is configured to cause a delay on a transition of a signal of the data line based on a delay current. The signal of the data line is configured for use in generating a signal of a control line of a memory cell of the memory macro.

In some embodiments, a delay current value of a delay current corresponding to a time delay that covers an access condition of a memory cell in a memory macro having a tracking circuit is determined. A current source is configured to provide the delay current. The delay current affects a transition of a signal of a data line of a tracking cell of the tracking circuit. The transition of the signal of the data line causes a transition of a signal of a control line of the memory cell.

In some embodiments, a tracking current value of a tracking cell of a tracking circuit for use in a memory macro is determined. The tracking cell affects a signal of a data line. A first current value corresponding to an access condition of a memory cell of the memory macro is determined. A second current value corresponding to a first condition of the signal of the data line is determined. Based on the tracking current value, the first current value, and the second current value, a third current value provided to the data line for the signal of the data line to be at a second condition is determined. The signal of the data line at the second condition is delayed compared with the signal of the data line at the first condition.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. A tracking circuit in a memory macro, comprising:
    a data line;
    a first tracking cell electrically coupled to the data line; and
    a plurality of transistors electrically coupled to the data line,
    wherein
        the plurality of transistors is configured to cause a delay on a transition of a signal of the data line based on a delay current; and
        the data line is configured for use in generating a signal of a control line of a memory cell of the memory macro.

2. The tracking circuit of claim 1, wherein the plurality of transistors is configured in one or a combination of a parallel connection and a series connection.

3. The tracking circuit of claim 1, wherein
the plurality of transistors is configured to cause the delay current based on one or a combination of a number of transistors of the plurality of transistors, a size of each of the plurality of transistors, a threshold voltage of each of the plurality of transistors, and an operational voltage of each of the plurality of transistors.

4. The tracking circuit of claim 1, further comprising a switching circuit configured to electrically connect and disconnect the plurality of transistors from the data line.

5. The tracking circuit of claim 1, further comprising a feedback transistor electrically coupled to the data line, and configured to electrically disconnect the plurality of transistors from the data line when the signal of the data line transitions past a threshold value of a logic gate having the data line as an input.

6. A method comprising:
determining a delay current value of a delay current corresponding to a time delay that covers an access condition of a memory cell in a memory macro having a tracking circuit; and
causing a current source to provide the delay current value, wherein
the delay current affects a transition of a signal of a data line of a tracking cell of the tracking circuit; and
the transition of the data line causes a transition of a signal of a control line of the memory cell.

7. The method of claim 6, wherein
the delay current value is based on a plurality of current values of currents sunk by a corresponding plurality of memory cells of the memory macro.

8. The method of claim 7, wherein
the delay current value corresponds to a current value that is based on a one-sigma, a two-sigma, a three-sigma, a four-sigma, a five-sigma, or a six-sigma value of the plurality of current values.

9. The method of claim 6, wherein
the current source includes at least one transistor; and
the delay current value is based on one or a combination of a size of a transistor of the at least one transistor, a threshold voltage value of the transistor of the at least one transistor, an operational voltage value of the transistor of the at least one transistor, and a number of transistors of the at least one transistor.

10. The method of claim 9, wherein the at least one transistor comprises a plurality of transistors, and the plurality of transistors are coupled in one or a combination of a parallel connection and a series connection.

11. The method of claim 6, wherein the transition of the signal of the data line of the tracking cell of the tracking circuit is a high to a low logical transition.

12. The method of claim 6, wherein determining the delay current value comprises the steps of:
determining a voltage value of a voltage on the data line; and
achieving the delay current value based on a current of the tracking cell of the tracking circuit at the voltage value of the voltage on the data line, a first current at the voltage value of the voltage on the data line that corresponds to an access condition of a memory cell, and a second current at the voltage value of the voltage on the data line that corresponds to a first condition of the data line,
wherein
the delay current corresponds to a second condition of the signal of the data line; and
the signal of the data line at the second condition is delayed compared with the signal of the data line at the first condition.

13. A method comprising:
determining a tracking current value of a tracking cell of a tracking circuit for use in a memory macro, the tracking cell affecting a signal of a data line;
determining a first current value corresponding to an access condition of a memory cell of the memory macro;
determining a second current value corresponding to a first condition of the signal of the data line; and
based on the tracking current value, the first current value, and the second current value, determining a third current value provided to the data line for the signal of the data line to be at a second condition, wherein the signal of the data line at the second condition is delayed compared with the signal of the data line at the first condition.

14. The method of claim 13, wherein
the tracking current value, the first current value, and the second current value are determined at a first voltage value of the data line.

15. The method of claim 13, wherein
the tracking current value is determined based on a first relationship between a tracking current of the tracking circuit and a voltage on the data line;
the first current value is determined based on a second relationship between a first current and the voltage on the data line; and
the second current value is determined based on a third relationship between a second current and the voltage on the data line.

16. The method of claim 13, wherein
a current value of a first current having the first current value is determined based on a plurality of current values of currents of memory cells of the memory macro.

17. The method of claim 16, wherein
the current value of the first current is determined based on a sigma value of the plurality of current values of the currents of the memory cells of the memory macro.

18. The method of claim 13, wherein
the tracking current value is determined based on an average of a plurality of current values of a plurality of tracking cells of the tracking circuit, the plurality of tracking cells affecting the signal of the data line.

19. The method of claim 13, wherein a third current having the third current value is provided by at least one of
a current source; and
at least one transistor, wherein, if the at least one transistor has a plurality of transistors, the plurality of transistors is coupled in one or a combination of a parallel connection and a series connection.

20. The method of claim 13, wherein
the third current value is provided by at least one transistor, a current value provided by a transistor of the at least one transistor is calculated based on one of a combination of a number of transistors of the at least one transistor, a size of the transistor, a threshold voltage of the transistor, and an operational voltage of the transistor.

* * * * *